United States Patent [19]

Mackenzie

[11] Patent Number: 6,072,317
[45] Date of Patent: Jun. 6, 2000

[54] PLUG-IN MULTIFUNCTION TESTER FOR AC ELECTRICAL DISTRIBUTION SYSTEM

[75] Inventor: Raymond Warren Mackenzie, Baldwin Borough, Pa.

[73] Assignee: Eaton Corporation, Cleveland, Ohio

[21] Appl. No.: 09/049,320

[22] Filed: Mar. 27, 1998

[51] Int. Cl.[7] .......................... G01R 31/08; G01R 31/00; H02H 3/16; G08B 21/00

[52] U.S. Cl. .......................... 324/536; 324/520; 324/508; 361/45; 340/650

[58] Field of Search .................... 324/536, 424, 324/508, 509, 520; 361/42, 45, 79; 340/647, 650

[56] References Cited

U.S. PATENT DOCUMENTS

| | | | |
|---|---|---|---|
| 3,898,557 | 8/1975 | Strock | 324/508 |
| 3,911,323 | 10/1975 | Wilson et al. | 340/650 |
| 3,952,244 | 4/1976 | Spear | 324/508 |
| 4,607,309 | 8/1986 | Bishop | 324/550 |
| 4,639,817 | 1/1987 | Cooper et al. | 361/62 |
| 4,816,746 | 3/1989 | Peak | 324/508 |
| 4,857,826 | 8/1989 | Graham | 324/508 |
| 5,047,724 | 9/1991 | Boksiner et al. | 324/520 |
| 5,224,006 | 6/1993 | MacKenzie et al. | 361/45 |
| 5,280,404 | 1/1994 | Ragsdale | 361/113 |
| 5,307,230 | 4/1994 | MacKenzie | 361/96 |
| 5,359,293 | 10/1994 | Boksiner et al. | 324/536 |
| 5,459,630 | 10/1995 | MacKenzie et al. | 361/45 |
| 5,515,218 | 5/1996 | DeHaven | 361/45 |
| 5,519,561 | 5/1996 | Mrenna et al. | 361/105 |
| 5,682,101 | 10/1997 | Brooks et al. | 324/536 |
| 5,691,869 | 11/1997 | Engel et al. | 361/42 |
| 5,818,237 | 10/1998 | Zuercher et al. | 324/536 |
| 5,834,940 | 11/1998 | Brooks et al. | 324/509 |

*Primary Examiner*—Josie Ballato
*Assistant Examiner*—Jermele M. Hollington
*Attorney, Agent, or Firm*—Martin J. Moran

[57] ABSTRACT

A portable tester plugs into a receptacle in a branch circuit of an electric power distribution system to verify protection against arc faults, line to ground faults and neutral to ground faults provided by a circuit breaker located at a remote load center or by ground fault and, or arc fault interrupters in the receptacle, and also checks for proper wiring. The arc fault detector gates phased back rectified half cycles of the ac power to generate step changes in the instantaneous amplitude of current in the branch circuit which mimic the repetitive striking of an arc. Preferably, only half cycles at least 60 ms apart are gated so that the user can verify the time to trip with a watch and can count the gated half cycles to trip by counting pulses generated by a light emitting diode (LED) in the gating circuit.

33 Claims, 6 Drawing Sheets

FIG.6
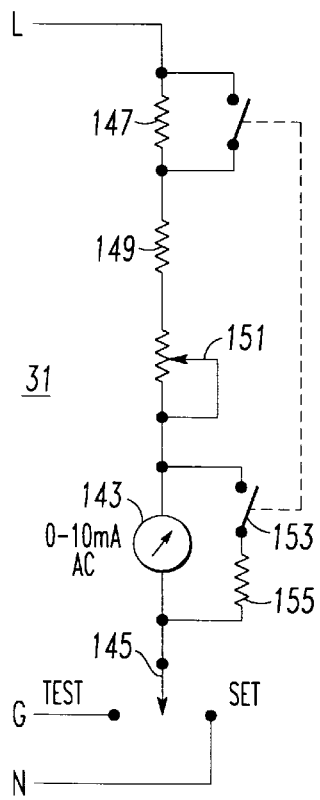
FIG.7
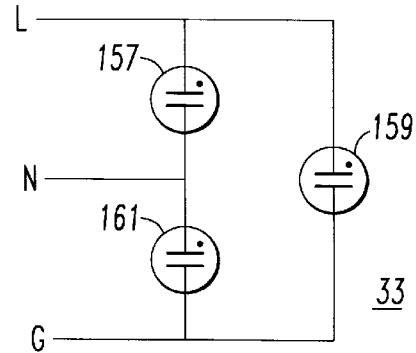
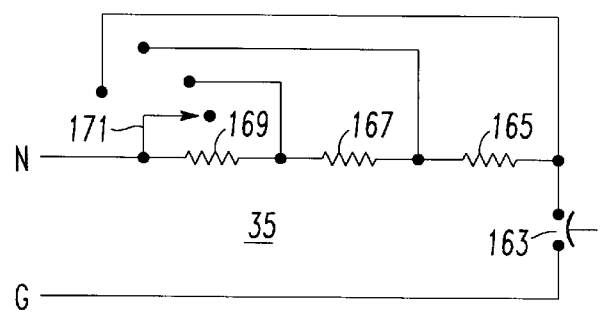
FIG.8
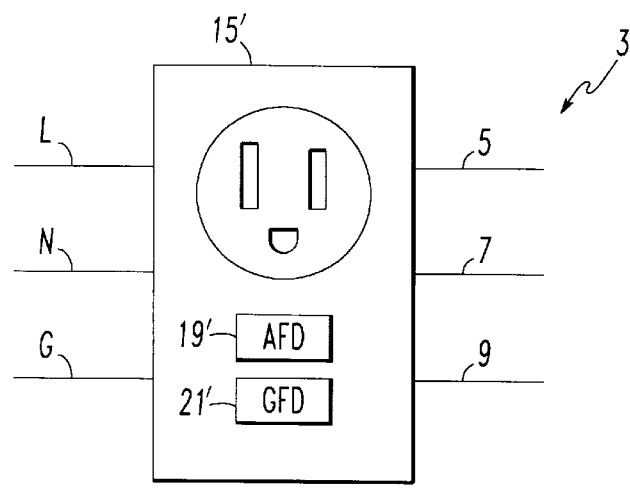
FIG.9

PLUG-IN MULTIFUNCTION TESTER FOR AC ELECTRICAL DISTRIBUTION SYSTEM

BACKGROUND OF THE INVENTION

1. Field of the Invention

This invention relates to testing of electrical distribution circuits, and particularly to a tester that plugs into a receptacle and tests especially arc fault protection, but can also perform ground fault, grounded neutral and proper wiring tests.

2. Background Information

The common type of circuit breaker used for residential, commercial, and light industrial applications has an electro-mechanical thermal-magnetic trip device to provide an instantaneous trip in response to a short circuit and a delayed trip in response to persistent overcurrent conditions. Some such circuit breakers include ground fault protection which trips the circuit breaker in response to a line to ground fault, and in some cases, a neutral to ground fault. Ground fault protection is provided by an electronic circuit which is set to trip at about 4–6 ma of ground fault current for people protection, and at about 30 ma for equipment protection. It is known to incorporate a test circuit in the circuit breaker which tests at least portions of the electronic ground fault test circuit. It is also known to test for proper wiring connections. Test circuits for this purpose are commercially available.

More recently, interest has arisen in providing protection against arc faults. Arc faults are intermittent, high impedance faults which can be caused for instance by worn insulation, loose connections, broken conductors and the like. Arc faults can occur in the permanent wiring, at receptacles, or more likely, in the wiring of loads or extension cords plugged into the receptacle. Because of their intermittent and high impedance nature, they do not generate currents of sufficient instantaneous magnitude or sufficient average current to trigger the thermal-magnetic trip device which provides the short circuit and overcurrent protection.

Arc fault detectors are generally of two types. One type responds to the random high frequency content of the current waveform generated by an arc. The other basic type of arc fault detector responds to the step increase in current occurring as the arc is repetitively and randomly struck. Examples of arc fault detectors of the latter type are disclosed in U.S. Pat. Nos. 5,224,006 and 5,691,869. Built-in test circuits have also been proposed for such arc fault detectors. U.S. Pat. No. 5,459,630 discloses several forms of built-in test circuits for such arc fault detectors. In one embodiment, in which the arc fault detector utilizes a coil to sense current, the test circuit adds a capacitor which forms with the impedance of the coil an oscillator generating a waveform with an amplitude which simulates the rapid rise of a step change in current produced by an arc. In another embodiment, the user must repetitively close a switch which connects a resistor between the line conductor and neutral to again generate large amplitude pulses.

While the built-in arc fault and ground fault testers test the response of the electronic circuits to simulated conditions, they do not necessarily indicate whether the device will adequately respond in a real installation. One difficulty is that the circuit breaker containing the detectors is located at a load center together with the circuit breakers for other the circuits in the installation. However, the fault condition can occur anywhere downstream and can be further distanced from the circuit breaker and detectors by an extension cord. The wiring, and particularly the extension cord, can insert considerable resistance between the fault and the detector which attenuates the signal sensed by the detector. When the effects of this resistance are combined with the low amplitude of the currents generated by these faults, the detectors may not have sufficient sensitivity to detect remote faults. Another problem can be a receptacle that is not connected as intended.

There is a need therefore for improved test circuits for electrical distribution systems and especially for testing arc fault detectors.

There is also a need for apparatus for testing arc fault and ground fault detectors for a response to faults in actual installations, especially faults which are remote from the detectors. In other words, there is a need for testers which verify whether protection is actually being provided at a remote location in a distribution circuit.

There is also a need for such testers which are flexible, simple, and economical.

SUMMARY OF THE INVENTION

These needs and others are satisfied by the invention which is directed to a tester particularly for testing an arc fault detector from a location external to a circuit breaker in which the arc fault detector is housed. It has particular application to testing the arc fault detector from a receptacle in the branch circuit of an ac electric power distribution system protected by the circuit breaker having the arc fault detector. The tester, which plugs into the receptacle preferably also includes a ground fault detector tester which can draw a selected amount of ground fault current, for instance to verify people or equipment ground fault protection provided by the circuit breaker. Additional test circuits such as a circuit testing for a grounded neutral condition and proper wiring can also be incorporated into the portable tester. The tester can also be used to test arc fault detectors and ground fault detectors provided in the receptacles.

As another aspect of the invention, the arc fault detector tester includes an impedance, a switch and means connecting the switch and impedance in series between the electrical conductors in the branch circuit at the receptacle. It further includes control means which turns the switch on at a selected number of electrical degrees in selected half cycles of the ac current to generate step changes in current in the branch circuit sufficient to actuate the arc fault detector. The control means comprises a zero crossing detector and a delay means which delays the turning on of the switch, and therefore the generation of the step change in current, for the selected number of electrical degrees after the zero crossings. While these step changes in current can be generated on each half cycle of the ac and the number of step changes required for a trip can be recorded by a counter, it is preferred that step changes be generated on selected half cycles which are at least 60 ms apart. With this arrangement, a signaling device such as a light emitting diode can provide an indication of each step change generated which can be manually counted by an observer. It also extends the time to trip to an interval which can be easily measured by the user with a watch. Preferably, a rectifier and particularly a full wave rectifier is connected in series with the switch and the impedance so that an inexpensive switch such as an silicon controlled rectifier (SCR) can be utilized. The rectifier also provides dc power for the control circuit and rectified pulses for the zero crossing detector.

BRIEF DESCRIPTION OF THE DRAWINGS

A full understanding of the invention can be gained from the following description of the preferred embodiments when read in conjunction with the accompanying drawings in which:

FIG. 6 is a schematic diagram of an optional circuit for testing the sensitivity of a ground fault detector which may be incorporated into the tester.

FIG. 7 is a schematic circuit diagram of a wiring test circuit which forms part of the tester.

FIG. 8 is a schematic circuit diagram of a neutral to ground test circuit which forms part of the tester.

FIG. 9 illustrates schematically a receptacle containing an arc fault detector and a ground fault detector which can be tested by the tester of the invention.

DESCRIPTION OF THE PREFERRED EMBODIMENTS

Figure 1:
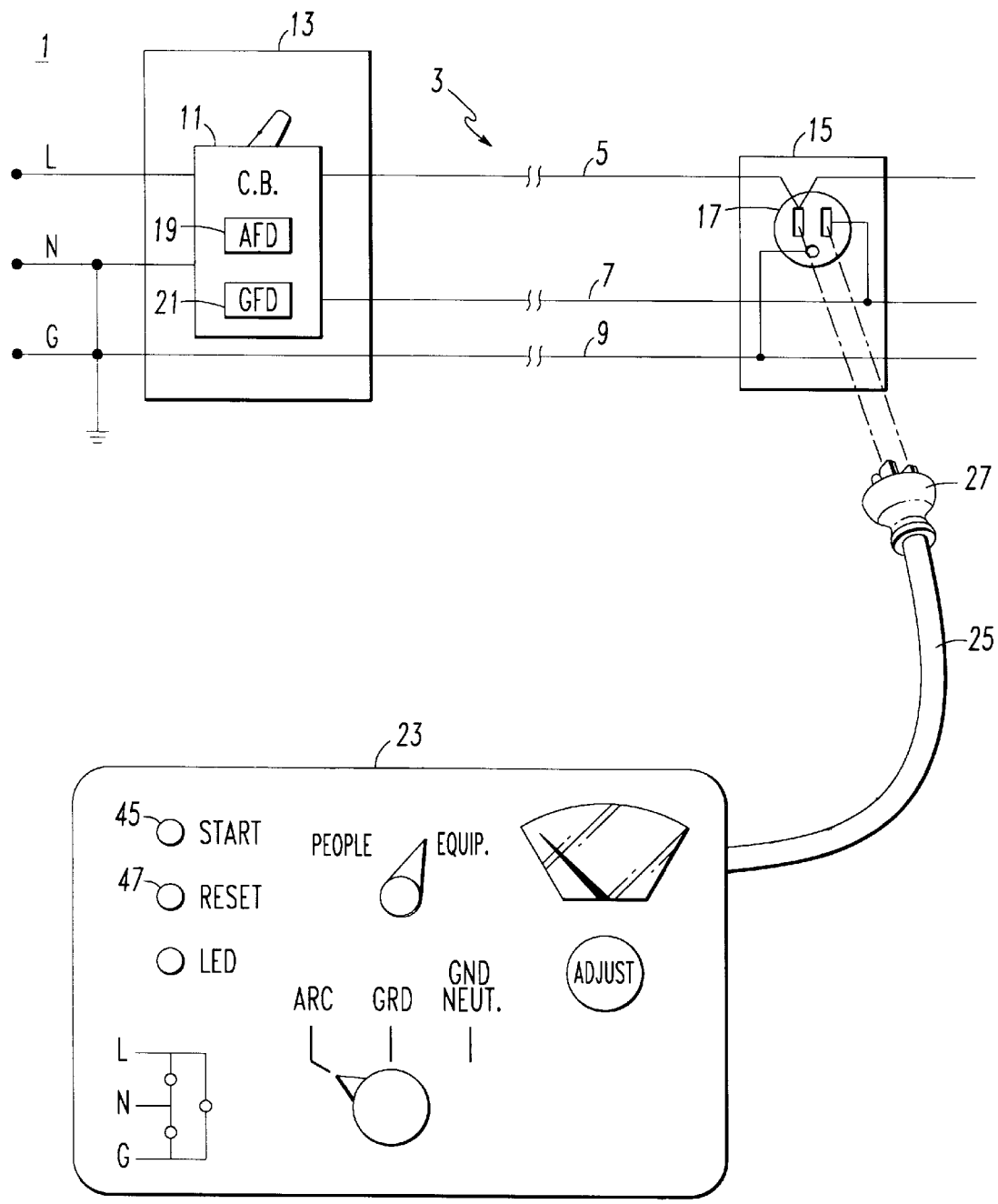
FIG. 1 is a schematic diagram of an electric power distribution system branch circuit in which a tester in accordance with the invention is plugged into a receptacle.

FIG. 1 illustrates an ac electric power distribution system 1 having a branch circuit 3 with a line conductor 5, a neutral conductor 7 and a ground conductor 9. A circuit breaker 11 mounted in a load center 13 provides overcurrent protection for the branch circuit 3. Typically, the load center 13 houses additional circuit breakers (not shown) providing protection for additional branch circuits (also not shown). As shown, the neutral conductor 7 and the ground conductor 9 are connected to earth ground on the utility side of the load center 13. Typically, the load center 13 is located in a basement or utility room and the branch circuit 3 extends through walls of the structure to provide electric power to a portion of the structure. At spaced locations remote from the load center are one or more receptacles 15. The receptacle 15 includes a female connector 17 for providing electric power to loads which are plugged into the connector 17.

The circuit breaker 11 provides conventional overcurrent protection through an instantaneous trip function and a delayed trip function. It also includes an arc fault detector 19 which detects arcs in the branch circuit, including the receptacle 15, or in loads connected through the receptacle 15, and trips the circuit breaker open. The circuit breaker 11 also includes a ground fault detector 21 which trips the circuit breaker open in response to line to ground or neutral to ground faults, again in the branch circuit 3 or loads connected through the receptacle.

In accordance with the invention, a portable field tester 23 has an electrical lead 25 with a male connector 27 which plugs into the female connector 17 in the receptacle. As will be discussed, the tester 23 can test the arc fault detector 19, the sensitivity of the ground fault detector 21, proper wiring of the branch 3 and receptacle 15 and the neutral to ground connection at the load center 13. The functions of the various indicators and selectors on the face of the portable detector 23 will become apparent from the following discussion.

Figure 2:
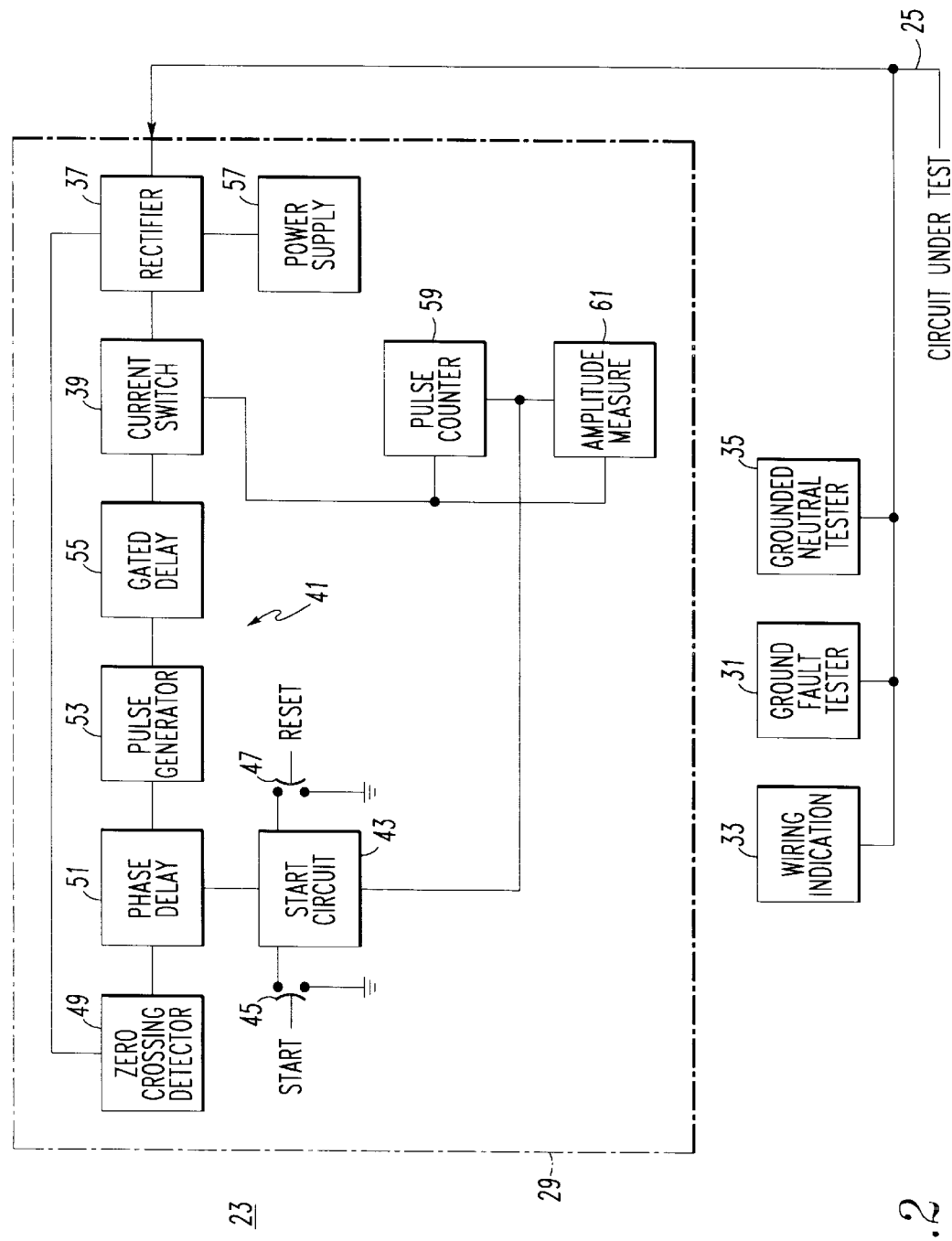
FIG. 2 is a schematic diagram in block form of the tester.

FIG. 2 is a block diagram of the tester 23. The basic components include an arc fault detector tester 29, a ground fault tester 31, a wiring indicator 33 and the grounded neutral tester 35. The arc fault detector test circuit 29 includes a full wave rectifier 37, a current switch 39 and a control circuit 41. The control circuit 41 includes a start circuit 43 with a start push button 45 and reset button 47. It also includes a zero crossing detector 49, a phase delay circuit 51, a pulse generator 53 and a gated delay 55. The rectifier 37 also energizes a power supply 57 for the control circuit 41.

The zero crossing detector 49 detects the beginning of each half cycle of current in the branch circuit from the full wave rectified signal generated by the rectifier 37. The phase delay circuit 51 provides a signal which triggers the pulse generator 53 a selected number of electrical degrees after the zero crossings of the half cycles. The gated delay 55, which is optional, passes selected pulses generated by the pulse generator 53 to the current switch 39. As will be seen, this causes a sizeable current in the branch circuit. Due to the delay in the half cycles of the ac current introduced by the phase delay circuit 51, there is a step increase in current when the current switch 39 is turned on which looks like the step increase generated when an arc is struck. This step increase in current which of course is drawn through the circuit breaker 11 provides a test for the arc fault detector 19. Without the gated delay 55, such a step increase in current would occur on every half cycle. The gated delay can be set to select half cycles which are at least about 60 ms apart so that the time for the arc fault detector to respond and trip the circuit breaker is an interval which can be timed by the user. As will be seen, it also can be used to assist the user in counting the number of arc simulating step increases in current that are required to actuate the arc fault detector. Optionally, the control circuit 41 can also include a pulse counter 59 which automatically records the number of step increases in current required to actuate the arc fault detector, and a circuit 61 for measuring the amplitude of the step increases in current.

Figure 3A:
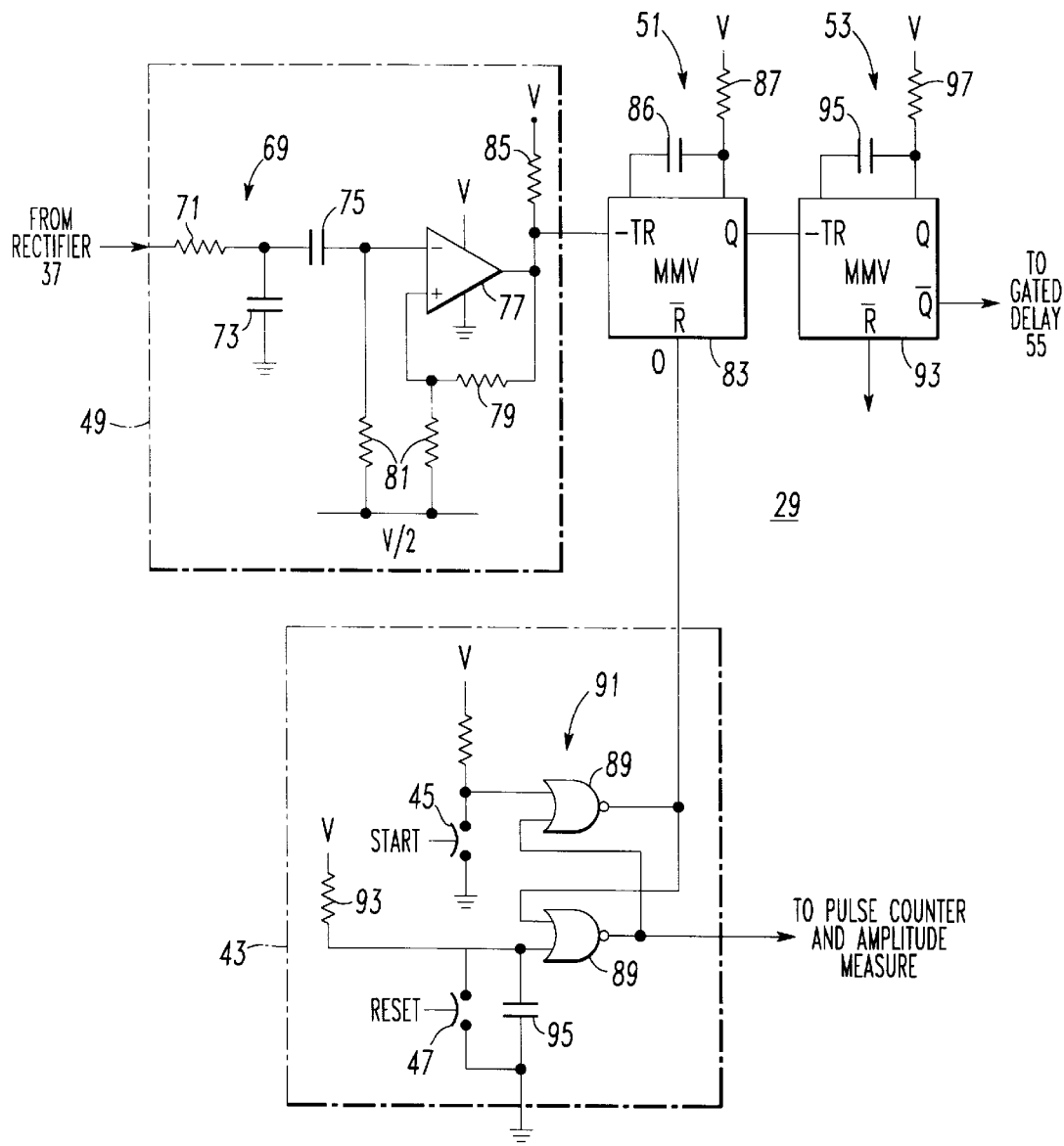
FIGS. 3a and 3b together disclose a schematic circuit diagram of the arc fault detector tester which forms part of the tester shown in FIG. 2.
Figure 3B:
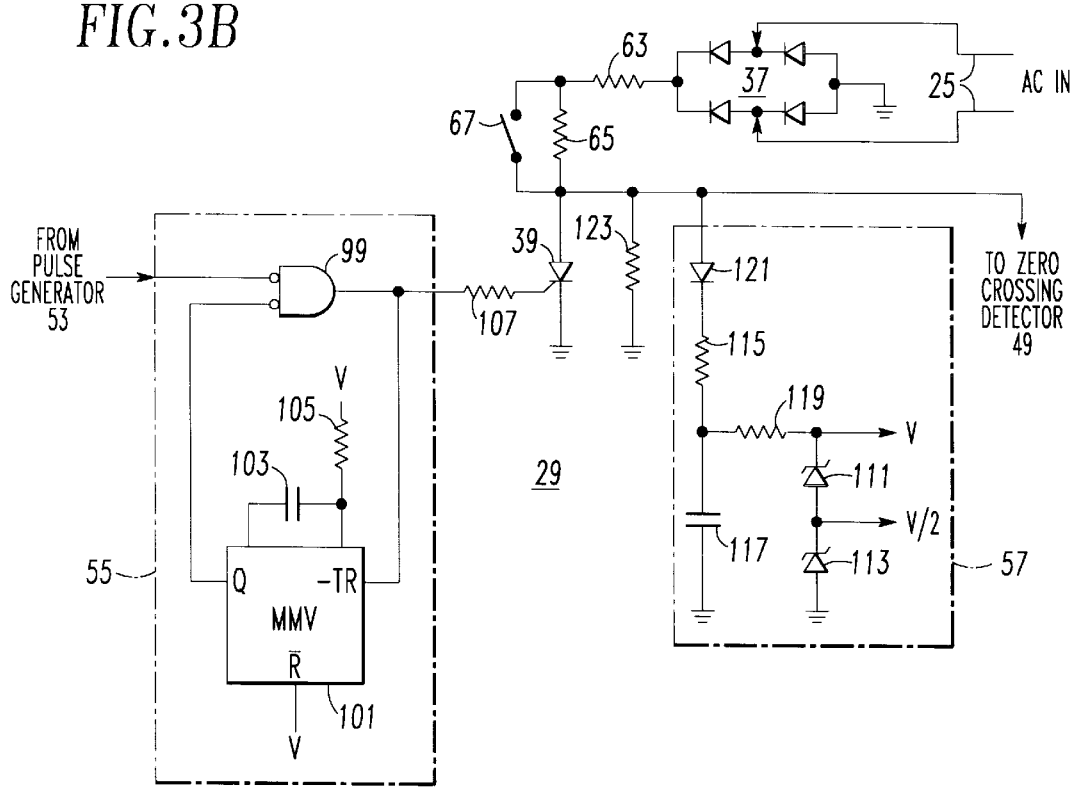

FIGS. 3a and 3b provide a schematic circuit diagram of the arc fault detector test circuit 29. The full wave rectifier 37 and an impedance in the form of a resistor 63 and, in certain applications an additional resistor 65 if the switch 67 is open, are connected in series with the current switch 39 across the conductors of the branch circuit 3 through the receptacle 15, connector 27, and the lead 25. In order to generate waveforms synchronized to the branch circuit, a timing signal must be derived from the branch circuit. The zero crossing detector 49 performs this task. It is supplied with a signal derived from the full wave rectifier 37, and therefore the ac component of this signal is 120 Hz. The signal is passed through a low pass filter formed by the resistor 71 and capacitor 73 followed by a high pass filter formed by the capacitor 75 in conjunction with the resistor 71. The zero crossing circuit 49 employs a comparator 77 with hysteresis provided through the resistor 79. A bias of half the supply voltage V/2 assures that both zero crossings of the ac ripple extracted by the filters are detected. The bias is applied through the resistors 81.

The output of the zero crossing detector 49 is applied as an input to the phase delay circuit 51. This circuit employs a monostable multivibrator 83 which provides a controlled time delay before current conduction begins. The multivibrator 83 is triggered by the trailing edge of the waveform output by the zero crossing detector 49. This occurs when the output of the comparator 77 goes low and the pull down resistor 85 allows the voltage applied to the monostable multivibrator 83 to fall from the supply voltage V. The time delay of the multivibrator 83 is set by the capacitor 86 and resistor 87. In order to minimize the power dissipation while providing reasonable peak current levels, the exemplary multivibrator 83 provides a delay of 135 electrical degrees, so that the current conduction angle will be 45 electrical degrees. The output of the zero crossing detector lags the actual crossings; however, the delay is fixed and is taken into account in setting the delay of the monostable multivibrator 83 so that the Q output goes high at the desired delay angle.

The phase delay monostable 83 is held in reset by the start circuit 43 until the start of the arc fault detector test is desired. The start circuit 43 uses a pair of NOR gates 89 to form an RS flip-flop 91. The RS flip-flop 91 is reset automatically on power up by means of the resistor 93 and capacitor 95 at the reset input terminal which makes the Q output of the RS flip-flop go low to hold the monostable in the reset state. Hence, even though the zero crossing detector 49 is generating an output, no signal is generated by the monostable 83. Closing of the start switch 43 pulls the upper input on the upper flip-flop 89 low so that the Q output goes high to release the monostable 83. The next trailing edge of a pulse from the zero crossing detector 49 causes the Q output of the monostable 83 to go high. After the proper time delay, this Q output goes low to trigger a second monostable multivibrator 93 which forms the pulse generator 53. This monostable 93 generates a short pulse with a duration long enough to turn on the current switch 39. The width of the pulses in the pulse signal generated by the monostable 93 are set by the capacitor 95 and resistor 97. A pulse duration of 5–10 μs is long enough to turn on the switch 39, but short enough so that the pulse terminates well before the next zero crossing of the line voltage. Although, as will be seen, the power supply 57 keeps the circuit energized for some time following a trip, no further pulses will be generated, as the ac input to the zero crossing detector 49 required to initiate the pulses will not be present. This is an important consideration as the output pulses to the current switch represent the heaviest current drain on the power supply 57.

The narrow pulses generated by the pulse generator monostable 93 are applied to the gated time delay circuit 55 as shown in FIG. 3b. This circuit uses a negative NAND gate 99 and another monostable multivibrator 101 in order to provide a timed interval between current pulses. In effect then, the circuit 55 selects pulses which are passed through to turn on the current switch 39. With the Q BAR output of the pulse generating monostable 93 normally high and the Q output of the monostable 101 normally low, the output of the negative NAND 99 is low. When the monostable 93 generates a pulse, the Q BAR output goes low and the output of the negative NAND 99 goes high to turn on the switch. When the pulse terminates and the Q BAR of the monostable 93 again goes high, the falling edge of the output of the negative NAND turns on the monostable 101 causing the Q output to go high thereby blocking further pulses from the monostable 93 from being passed through to turn on the current switch 39. The interval during which the pulses are blocked is determined by the time delay of the monostable 101 set by the capacitor 103 and resistor 105. The pulses passed by the gated delay 55 are applied through a resistor 107 to the current switch 39 which in the preferred embodiment of the invention is a silicon controlled rectifier (SCR).

Figure 3C:
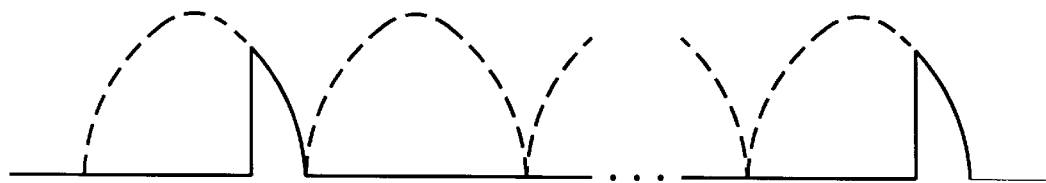
FIG. 3 illustrates an exemplary waveform generated by the arc fault detector tester of FIGS. 3a and 3b.

An example of the current waveform 40 generated by turn on of the current switch 39 is shown in FIG. 3c. As can be seen, turn on of the switch 39 at the 135 electrical degree point produces a sharp increase in current similar to the waveform generated by an actual arc. The SCR 39 being self commutating turns off at the zero crossing. As mentioned, the pulses generated by the pulse generator 53 are short enough in duration that they terminate before the zero crossing. If the gated delay 55 which selects the half pulses on which the current switch 39 is turned on is eliminated, or its delay interval is reduced so that it resets before the zero crossing, then the SCR 39 will be turned on in every half cycle of the rectified ac. As mentioned, selecting half cycles at least 60 ms apart provides a sufficient time to trip that it can be manually timed with a watch.

The rectifier 37 supplies power for the power supply 57 which includes a pair of zener diodes 111 and 113 producing dc voltages V and V/2 for the circuits of the tester. A resistor 115 and capacitor 117 filter the dc voltage and resistor 119 limits the current drawn by the power supply. The value of the capacitor 117 is large so that the power supply remains energized for some time after the circuit breaker trips, permitting the outputs of the optional measuring circuits described below to be noted following a trip. A diode 121 prevents the SCR 39 or resistor 123 from discharging the capacitor 117. The rectifier 37 also provides the timing signal to the zero crossing detector 49 as mentioned. A resistor 123 assures that the voltage at the anode of the SCR 39 will fall with the half cycles of the rectified current despite the input filter on the zero crossing detector.

While the power supply 57 and the zero crossing detector 49 continuously draw current through the rectifier bridge 37, the amplitude of this continuous draw of current is minimal compared to the current pulses generated by turn on of the SCR.

Figure 4:
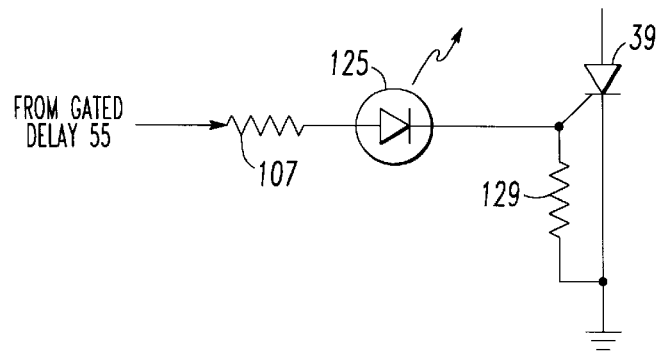
FIG. 4 shows an alternate embodiment of a portion of the tester circuit of FIG. 3b incorporating a light emitting diode for monitoring operation of the tester.

Optional means may be provided to monitor the number and/or amplitude of the current pulses produced by turn on of the SCR 39 before a trip occurs. As shown in FIG. 4, the simplest method of monitoring the number of current pulses is to insert a signaling device such as a light emitting diode (LED) 125 in the gate circuit for the SCR 39 so that the pulses can be counted visually. Selection of pulses at least 60 ms apart by the gated delay 55 provides this capability. The resistor 129 provides sufficient gate current to turn on the SCR and allows the LED to draw sufficient current for visibility.

Figure 5:
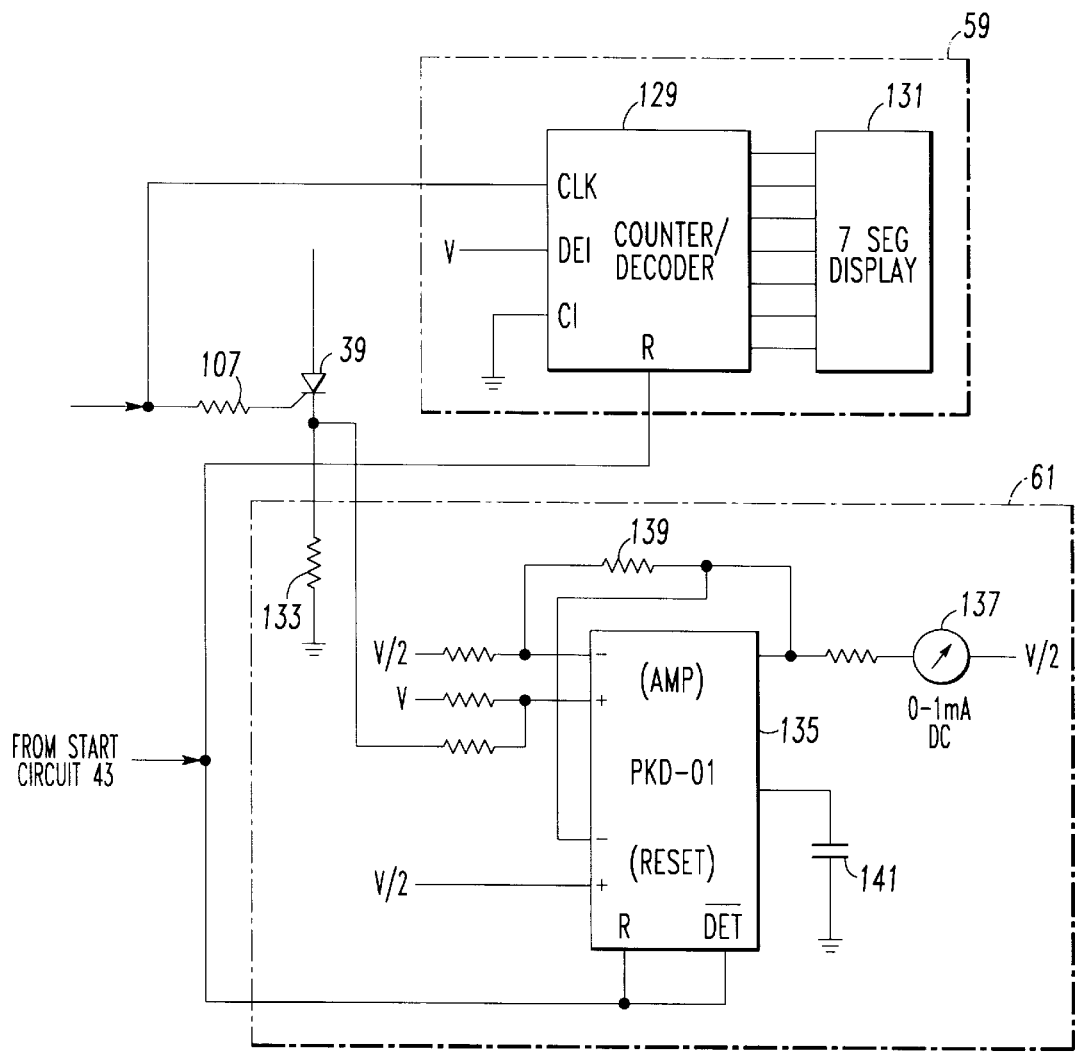
FIG. 5 illustrates another embodiment of a portion of the tester circuit of FIG. 3b which provides an arrangement for displaying a count of the number of step changes in current generated by the tester and also for measuring the amplitude of the step changes.

Alternatively, or additionally, the gate pulses can be automatically counted by the pulse counter 59 which, as shown in FIG. 5, includes an electronic counter and decoder 129 and a display 131. The counter is reset by the Q BAR output of the RS flip-flop 91 of the start circuit 43. When the start button 45 is depressed, the reset on the counter/decoder 129 is removed. The gated delay 55 is not necessary when this electronic counter is used. Although the bridge rectifier 37 is deenergized when the circuit breaker is tripped, the capacitor 117 (see FIG. 3b) keeps the display 131 energized long enough to be read.

To monitor the amplitude of the step increases in current generated by turn on of the SCR, a small resistor 133 is inserted in series with the cathode of the SCR 39 as shown in FIG. 5. A peak detecting circuit 135 is then connected to the junction of the resistor 133 and the SCR cathode in order to measure and hold a value proportional to the peak current value. Level shifting is employed at the inputs to the peak detector 135 in order to use this device without bipolar power supplies. As discussed, the arc fault detector 19 in the circuit breaker 11 responds to the value of the step increase in current. By starting the current pulse at or after the 90 degree point of the half cycles of the current, the value of the current step is equal to the peak current value. The peak detector current circuit 135 may be used by itself, or with either type of pulse counter described above.

The peak detector circuit 135 output can be used to drive a calibrated meter 137. The gain for driving the meter is set by a resistor 139. The peak detector 135 is reset by the start flip-flop 91 and the capacitor 141 stores a voltage level proportional to the peak value of the current. In the exemplary embodiment shown, the meter 137 is analog, but obviously, a digital meter may also be used.

The ground fault test circuit 31 is shown in FIG. 6. It provides a metered current between the line and ground conductors 5 and 7 of the branch circuit 3. An ac meter 143 is connected by a switch 145 in series with resistors 147 and 149 and the potentiometer 151 between the line and ground conductors through the receptacle 15. The switch 145 is first placed in a SET position which connects the meter and the resistors between the load and neutral for setting the current for the test by adjusting the potentiometer 151. With the test current set at 4–6 ma for a ground fault detector providing people protection, the switch 145 is then moved to the test position to generate the desired ground current. For testing a ground fault detector providing equipment protection, a single pole double throw switch 153 can be closed to shunt the resistor 147 and change the meter range with the shunt resistor 155 so that the test current can be set to 30 ma in the SET position. Again the switch 145 is moved to the test position to generate the desired 30 ma ground fault current.

The wiring indicator test circuit 33 is shown in FIG. 7. Neon bulbs 157, 159 and 161 are connected, respectively, between line and neutral, neutral and ground, and line and ground. While this known test is typically run at installation to assure proper wiring, it is desirable to include it in the tester so that proper wiring can be assured before running the grounded neutral test which is to be described. If the branch circuit 3 and receptacle 15 are wired correctly, the neon bulbs 157 and 161 between the line and neutral, and the line and ground conductors should light, but the bulb 161 between the neutral and ground should not illuminate. Any other combination of neon bulb indications should be investigated.

The grounded neutral test circuit 35 is shown in FIG. 8. As described previously, the neutral conductor 7 of the branch circuit 3 is grounded at the utility side of the load center 13. The ground lead 9 is also grounded there. The neutral conductor 7 should have no other ground connection. The circuit 35 makes such an additional connection of the neutral to ground. This circuit tests the sensitivity of the neutral to ground portion of the ground fault detector 21, if provided. The circuit 35 includes a push button 163 which connects three series connected resistors 165, 167 and 169 between neutral and ground. A selector switch 171 selectively shorts out these resistors. The neutral to ground portion of the ground fault detector 21 responds to current in a loop formed by the neutral conductor and ground conductor through the connection at the load center and the connection made by the circuit 35. It should trip even with up to two ohms resistance in this loop. If the receptacle 15 is close to the load center, the selector switch 171 is turned to the position shown in FIG. 8 to insert collectively two ohms into the loop. If the receptacle 15 is far away from the load center, there could be two ohms resistance just in the conductors of the branch circuit, so the switch 171 is turned full counterclockwise so that all of the resistors 165, 167 and 169 are shunted. At intermediate positions, other values of resistance can be inserted into the loop by the selector switch 171.

The tester 23 provides additional testing not currently available with the built-in test circuits provided in some arc fault and ground fault circuit breakers. While the arc fault detector may correctly pass an internal test, this does not provide assurance that adequate arc fault protection is actually being provided in a particular branch circuit. As has been discussed, the arc fault detector 19 in the circuit breaker 11 responds to a time attenuated accumulation of the pulses generated by the striking of an arc. Lower amplitude arc currents require more pulses to generate a trip. By setting the amplitude of the signals in the arc fault test circuit 29 to this minimum amplitude, an indication is provided whether the circuit breaker will in fact respond to such a minimum current arc at the remote receptacle 15. This does not mean that the arc fault detector 19 is not functioning properly, but it does indicate that the desired protection is not being provided at the receptacle 15. Similarly, the grounded neutral tester 35 provides an indication whether the ground fault detector is actually providing protection for neutral to ground faults occurring in the vicinity of the receptacle 15. Since the ground fault detector tester 31 sets a current which is drawn through the circuit breaker 11 no matter where the fault is located, it provides a more general test of the line to ground fault protection.

The tester 23 of the invention can also be used to test ground fault and arc fault protection provided in a receptacle. Thus, referring to FIG. 9, a receptacle 15' includes an arc fault detector 19' and a ground fault detector 21' connected to the conductors 5, 7 and 9 of the electrical system 3. The tester 23 plugs into the receptacle 15' to provide testing of the arc fault detector 19' and the ground fault detector 21' in the manner discussed above while also providing a test of the grounded neutral connection and proper wiring. As the arc fault detector 19' in the receptacle is more accessible for resetting, its sensitivity can be increased. The arc fault test of the tester 23 can be appropriately adjusted. Preferably it could have a selectable sensitivity for testing the arc fault detectors 19' in the receptacle and the arc fault detector 19 in the circuit breaker.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breath of the claims appended and any and all equivalents thereof.

What is claimed is:

1. A tester for an arc fault detector for detecting arc faults in electrical conductors of a branch circuit in an ac electrical system, said tester comprising:

an impedance;

a switch;

means connecting said impedance and switch in series between said electrical conductors of said electrical system external to said arc fault detector; and control means turning said switch on at a selected number of electrical degrees in selected half cycles of ac current in said electrical conductors to generate step changes in current in said electrical conductors sufficient to actuate said arc fault detector.

2. The tester of claim 1 wherein said means connecting said impedance and switch between said conductors includes rectifier means rectifying current which passes through said impedance and switch.

3. The tester of claim 2 wherein said rectifier means comprises a full wave rectifier.

4. The tester of claim 2 wherein said control means includes a power supply and said rectifier means powers said power supply.

5. The tester of claim 1 wherein said control means includes means selecting half cycles of ac current for turning on said switch which are at least 60 ms apart.

6. The tester of claim 1 wherein said control means comprises a zero crossing detector, time delay means responsive to said zero crossing detector to generate an on signal at said selected number of electrical degrees in half cycles of said ac current and means applying said on signal to turn said switch on.

7. The tester of claim 6 wherein said control means also includes means limiting turn on of said switch to half cycles at least 60 ms apart.

8. The tester of claim 7 wherein said control means further includes signal generating means responsive to said on signal to provide indication each time said switch is turned on.

9. The tester of claim 8 wherein said signal generating means comprises a light emitting diode.

10. The tester of claim 7 wherein said means connecting said impedance and said switch between said conductors includes rectifying means in series with said impedance and switch between said conductors of said electrical system.

11. The tester of claim 6 wherein said control means includes counting means counting half cycles in which said switch is turned on.

12. The tester of claim 11 wherein said means connecting said impedance and said switch between said electrical conductors comprises rectifier means connected in series with said impedance and said switch.

13. A tester for a circuit breaker having an arc fault detector for detecting arc faults in a branch circuit of an ac electrical system having electrical conductors and a receptacle connected to said electrical conductors remotely from said circuit breaker, said tester comprising:

connector means connecting to said electrical conductors through said receptacle; and test circuit means connected to said electrical conductors through said connector and comprising arc fault detector test means selectively drawing through said electrical conductors a current having step changes in instantaneous amplitude sufficient in magnitude to actuate said arc fault detector in said circuit breaker.

14. The tester of claim 13 adapted for use with said circuit breaker also having a ground fault detector for detecting ground faults in said branch circuit of said ac electrical system and wherein said test circuit means includes ground fault detector test means selectively providing a current limited connection to ground.

15. The tester of claim 14 wherein said ground fault detector test means comprises means selectively setting a ground fault current to a first setting for people protection and a second setting for equipment protection.

16. The tester of claim 14 adapted for use in a branch circuit in an ac electrical system wherein said electrical conductors include a line conductor, a neutral conductor and a ground conductor with said neutral conductor connected to ground adjacent to said circuit breaker, and wherein said test circuit means further includes neutral to ground test means comprising means inserting a selectable impedance in a neutral to ground connection.

17. The tester of claim 16 wherein said test circuit means further includes wiring tester means providing an indication of correct wiring of said electrical conductors.

18. The tester of claim 13 adapted for use with said circuit breaker having a predetermined current rating, and wherein said arc fault detector test means draws current with step changes which exceed said current rating in amplitude.

19. The tester of claim 13 adapted for use in said electrical system in which said electrical conductors include a line conductor, a neutral conductor and a ground conductor with said neutral conductor connected to ground adjacent said circuit breaker, and wherein said test circuit means further includes a neutral to ground test means.

20. The tester of claim 19 wherein said neutral to ground test means comprises means inserting a selectable impedance between said neutral conductor and said ground conductor.

21. The tester of claim 13 adapted for use in an electrical system in which said electrical conductors include a line conductor, a neutral conductor and a ground conductor with said neutral conductor connected to ground adjacent said circuit breaker, said test circuit means including wiring tester means providing an indication of correct wiring of said electrical conductors.

22. The tester of claim 13 wherein said arc fault detector test means comprises an impedance, a switch, means connecting said impedance and switch in series between said electrical conductors of said ac electrical system through said connector, and control means turning said switch to an on state at a selected number of electrical degrees in selected half cycles of ac current in said electrical conductors.

23. The tester of claim 22 wherein said control means includes means selecting half cycles of said ac current for turning said switch on which are at least 60 ms apart.

24. The tester of claim 22 wherein said control means comprises a zero crossing detector, time delay means responsive to said zero crossing detector to generate an on signal at said selected number of electrical degrees in half cycles of said ac current and means applying said on signal to turn said switch on.

25. The tester of claim 24 wherein said connecting means includes rectifying means connected in series with said impedance and said switch between said electrical conductors.

26. A tester for an arc fault detector mounted in a receptacle connected to electrical conductors in a branch circuit of an ac electrical system, said tester comprising:

connector means connecting to said electrical conductors through said receptacle; and test circuit means connected to said electrical conductors in said branch circuit through said connector means and comprising arc fault detector test means selectively drawing through said electrical conductors a current having step changes in instantaneous amplitude sufficient in magnitude in actuate said arc fault detector in said receptacle.

27. The tester of claim 26 adapted for use with said receptacle also having a ground fault detector for detecting ground faults in said branch circuit of said ac electrical system and wherein said test circuit means includes ground fault detector test means selectively providing a current limited connection to ground.

28. The tester of claim 27 wherein said ground fault detector test means comprises means selectively setting a ground fault current to a first setting for people protection and a second setting for equipment protection.

29. The tester of claim 26 adapted for use in an electrical system in which said electrical conductors include a line conductor, a neutral conductor and a ground conductor with said neutral conductor connected to ground, and wherein said test circuit means further includes neutral to ground test means.

30. The tester of claim 26 adapted for use in an electrical system in which said electrical conductors include a line conductor, a neutral conductor, and a ground conductor with said neutral conductor connected to ground, said test circuit means including wiring tester means providing an indication of correct wiring of said electrical conductors.

31. The tester of claim 26 wherein said arc fault detector test means comprises an impedance, a switch, means connecting said impedance and switch in series between said electrical conductors of said ac electrical system through said connector, and control means turning said switch to an on state at a selected number of electrical degrees in selected half cycles of ac current in said electrical conductors.

32. The tester of claim 31 wherein said control means includes means selecting half cycles of said ac current for turning said switch on which are at least 60 ms apart.

33. The tester of claim 32 wherein said control means comprises a zero crossing detector, time delay means responsive to said zero crossing detector to generate an on signal at said selected number of electrical degrees in half cycles of said ac current and means applying said on signal to turn said switch on.

* * * * *